United States Patent [19]
Jones

[11] 3,978,472
[45] Aug. 31, 1976

[54] DIGITAL VOLT-OHMMETER

[75] Inventor: Robert E. Jones, Fishkill, N.Y.

[73] Assignee: International Business Machines Corporation, Armonk, N.Y.

[22] Filed: Apr. 30, 1975

[21] Appl. No.: 573,189

[52] U.S. Cl. .................. 340/347 CC; 340/347 AD; 324/62
[51] Int. Cl.² ........................................ H03K 13/17
[58] Field of Search ............... 340/347 CC, 347 AD; 324/62 R, 99 D, 130

[56] References Cited
UNITED STATES PATENTS

| | | | |
|---|---|---|---|
| 3,438,024 | 4/1969 | Smith | 340/347 CC |
| 3,445,839 | 5/1969 | Engelberg | 340/347 CC |
| 3,510,603 | 5/1970 | Gaerttner | 340/347 AD |
| 3,711,850 | 1/1973 | Kelly | 324/62 X |

OTHER PUBLICATIONS

Peterson, "IBM Technical Disclosure Bulletin," vol. 6, No. 7, Dec. 1963, pp. 85–86.

Primary Examiner—Charles D. Miller
Attorney, Agent, or Firm—Sughrue, Rothwell, Mion, Zinn and Macpeak

[57] ABSTRACT

A low-cost but highly accurate ohmmeter for measuring milliohm resistances is disclosed. The instrument employs a digital voltmeter (analog-to-digital converter) having an add-subtract mode which nulls any drift voltage following each measurement. A self biasing current source which eliminates common mode voltages to the high gain amplifier portion of the converter is used for resistance measurements.

6 Claims, 6 Drawing Figures

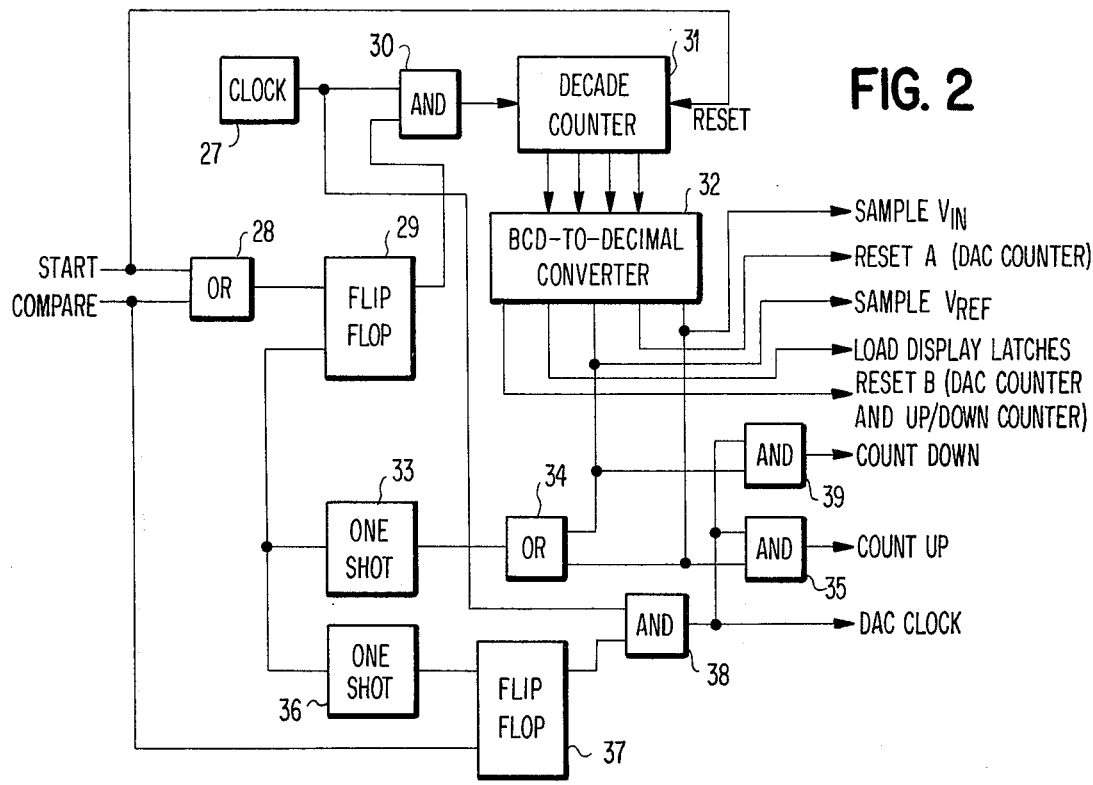
FIG. 2
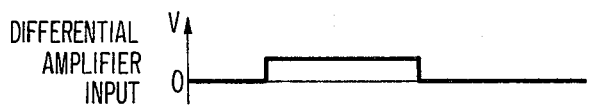
FIG. 3A — DIFFERENTIAL AMPLIFIER INPUT
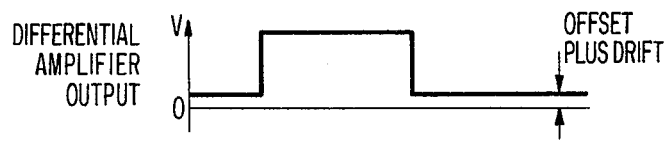
FIG. 3B — DIFFERENTIAL AMPLIFIER OUTPUT — OFFSET PLUS DRIFT
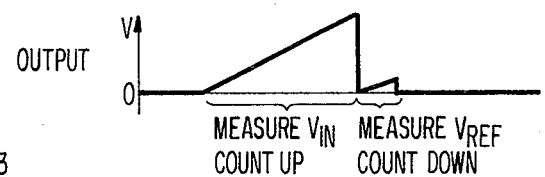
FIG. 3C — OUTPUT — MEASURE $V_{IN}$ COUNT UP — MEASURE $V_{REF}$ COUNT DOWN
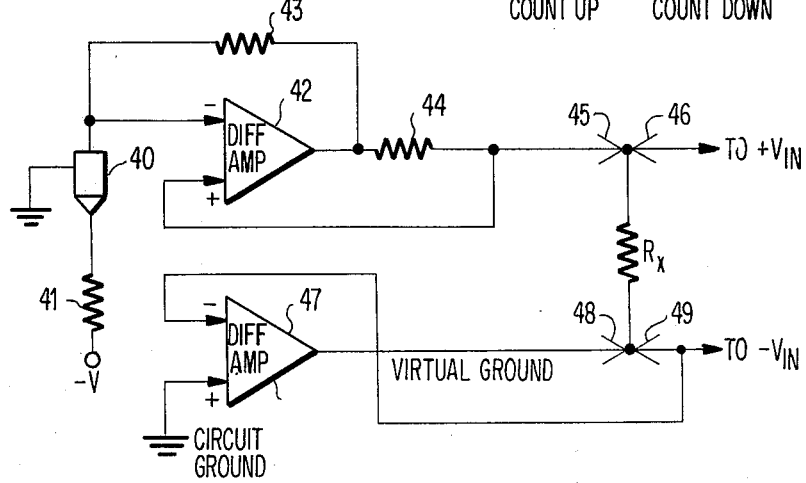
FIG. 4

3,978,472

DIGITAL VOLT-OHMMETER

BACKGROUND OF THE INVENTION

The present invention generally relates to electrical measuring instruments, and more particularly to an improved digital volt-ohmmeter capable of measuring milliohm resistances with precision and high accuracy.

The heart of any digital volt-ohmmeter is an analog-to-digital converter. Typically, the converter has an analog section and a digital section. The analog section may comprise a high gain differential amplifier connected to receive an input voltage across its input terminals and to provide an output voltage to one input of an analog comparator. The other input of the analog comparator in connected to a source of reference voltage, and when the voltages applied to the two inputs of the analog comparator are equal, an output signal indicative of this condition is generated. The digital section of the analog-to-digital converter may comprise a source of clock pulses connected through a gate to a digital counter. The output signal from the analog comparator is used to develop a gating signal so that the accumulated count in the digital counter is proportional to the voltage connected across the inputs of the high-gain differential amplifier. At the end of the measurement, the count accumulated in the digital counter may be either read out or displayed in a well known manner.

Problems arise in the measurement of very small voltage or resistance values. For example, it is often desirable to reliably and accurately measure the resistance of connections to integrated circuits. Such resistances are in the range of millohms. In order to measure such very small resistance values, it is necessary to significantly increase the gain of the input differential amplifier. Very high gains on the order of 1000 are often necessary; however, such high gains are usually accompanied by amplifier drift which adversely affects the accuracy of the measurement made. Moreover, because of the very high gain amplifier required for the measurement of such small resistances, common mode voltages to the amplifier cannot be tolerated.

SUMMARY OF THE INVENTION

It is therefore an object of the present invention to provide a low-cost but highly accurate precision ohmmeter for measuring milliohm resistances. The foregoing and other objects of the invention are attained by providing an analog-to-digital converter having an add-subtract mode which nulls any drift voltage following each measurement. For resistance measurements, the instrumental comprises a self-biasing current source which eliminates common mode voltages to the amplifier portion of the converter. The system sensitivity achieved by the present invention is 10µV per milliohm.

BRIEF DESCRIPTION OF THE DRAWINGS

The specific nature of the invention, as well as other objects, aspects, uses and advantages thereof, will clearly appear from the following description and from the accompanying drawings, in which:

FIG. 2 is a logic diagram of the clock and mode control logic which forms a part of the digital voltmeter shown in FIG. 1;

FIGS. 3A, 3B and 3C are wave forms illustrating the operation of the digital voltmeter according to the present invention; and FIG. 4 is a schematic diagram of the self-biasing current source used with the digital voltmeter of FIG. 1 for making resistance measurements. de

DESCRIPTION OF THE PREFERRED EMBODIMENTS

Figure 1:
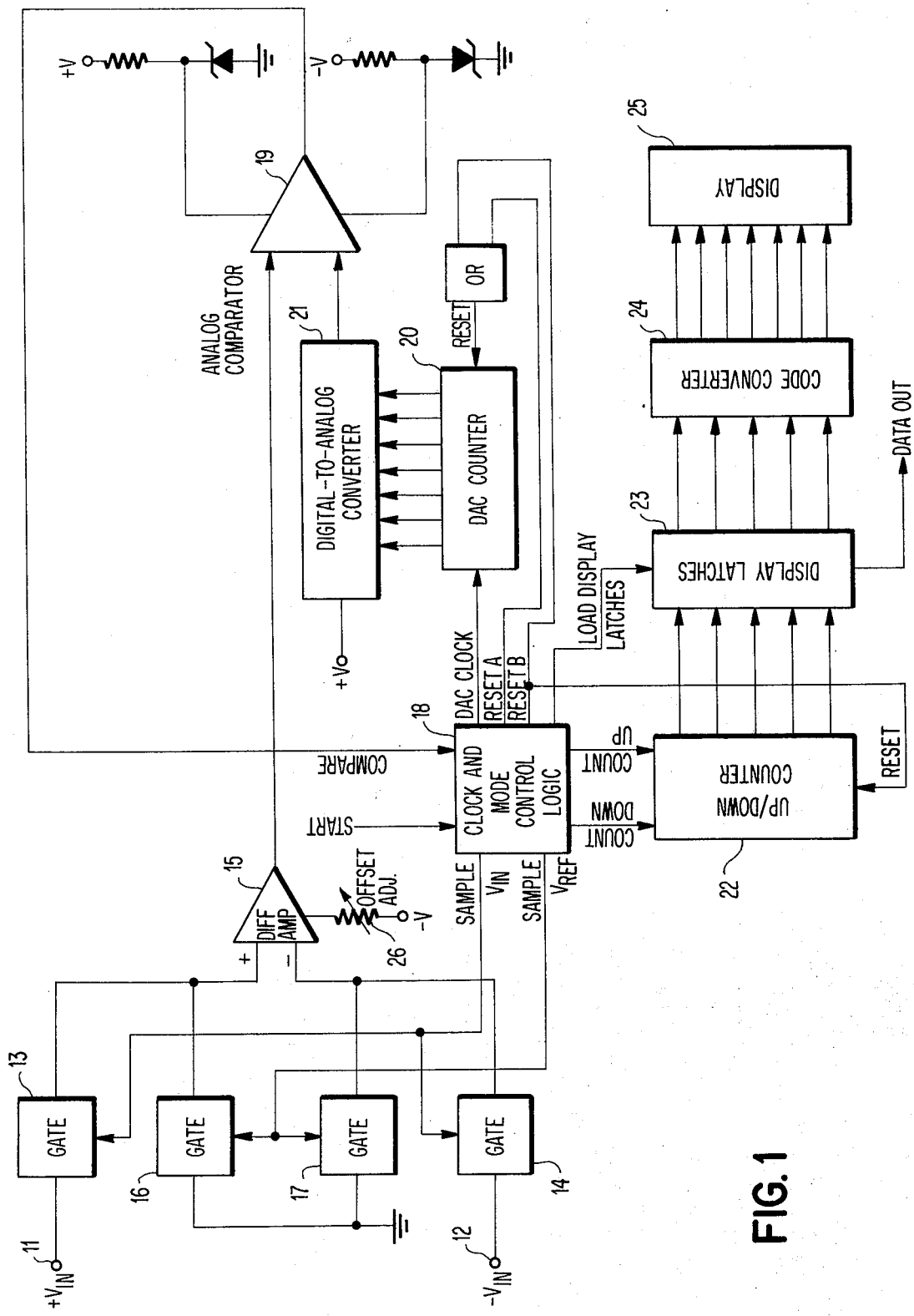
FIG. 1 is a block diagram of the digital voltmeter according to the present invention.

Referring to FIG. 1 of the drawings, the voltage which is to be measured is applied across input terminals 11 and 12 of gates 13 and 14, respectively. The output of gate 13 is connected to the positive input of high-gain differential amplifier 15, while the output of gate 14 is applied to the negative input of amplifier 15. Circuit ground is connected to the inputs of gates 16 and 17, and the outputs of gates 16 and 17 are connected to the positive and negative inputs, respectively, of the high gain differential amplifier 15. Gates 13, 14 and 16, 17 are controlled by the clock and mode control logic 18 as explained in more detail hereinafter, particularly with reference to FIG. 2 of the drawings.

The output of high gain differential amplifier 15 is applied to one input of one analog comparator 19. Analog comparator 19 is a conventional device, known in the art, and is shown as comprising both positive and negative reference voltage sources. The high-gain differential amplifier 15 and the analog comparator 19 constitutes the analog portion of the analog-to-digital converter.

The digital portion of the analog-to-digital converter includes a binary counter 20 with provides a parallel output to digital-to-analog converter (DA) 21. The DAC counter 20 receives a gated clock pulse signal, referred to as the DAC clock, from the clock and mode control logic 18. The accumulated count in DAC counter 20 is converted to a corresponding analog voltage by the digital-to-analog converter 21 in a well-known manner. For example, the digital-to-analog converter 21 may be either a resistive or capacitive ladder network of a known design. The output of digital-to-analog converter 21 is connected to the second input of the analog comparator 19.

In addition to the DAC counter 20, there is also provided an up/down counter 22, also of well-known type. Up/down counter 22 counts in a forward or up direction in response to count up clock pulses from the clock and mode control logic 18 and counts in a backwward or down direction in response to count down clock pulses from the clock and mode control logic 18. The parallel outputs from up/down counter 22 are connected to display latches 23 which are enabled at the completion of a measurement by the clock and mode logic 18. The outputs of the display latches 23 are connected in parallel to a binary to decimal code converter 24 which energizes a suitable display device 25. Alternatively, the contents of the display latches 23 could be read out to some other data utilization device.

The differential amplifier 15 is set up so that it has an offset voltage which is always positive, but the amplitude of that offset voltage is not known because of the long term drift problems associated with very high gain DC amplifiers. This offset voltage adjustment is illustratively shown in FIG. 1 as provided by a variable resistance 26 connected to a source of negative voltage. The up/down counter 22 is used to subtract this output offset after each measurement. When the unknown voltage is being measured, the count that is accumulated in the up/down counter 22 represents the sum of the amplifier gain times $V_{in}$ plus the amplifier offset voltage at the time of a first "compare" output from analog comparator 19. In order to obtain the correct representation of the unknown voltage $V_{in}$, the inputs of the high gain differential amplifier 15 are switched to ground reference potential, and the amplifier output voltage binary representation is subtracted from the number previously counted in up/down counter 22. After this offset voltage is substracted, the count remaining in the up/down counter 22 is representative of only the unknown voltage $V_{in}$.

In order to accomplish the measurement as just described, the clock and mode control logic 18 must control the following sequence of events:

1. Reset DAC and up/down counters 20 and 22, respectively, to 0.
2. Switch differential amplifier 15 inputs $\pm V_{in}$.
3. Select "count up" mode for up/down counter 22.
4. Gate clock pulses to DAC and up/down counters 20 and 22.
5. Stop the clock pulse output when a "compare" signal is generated by the analog comparator 19.
6. Reset the DAC counter 20.
7. Select to "count down" mode for up/down counter 22.
8. Switch the input of amplifier 15 to ground reference potential.
9. Gate clock pulses to DAC and up/down counters 20 and 22.
10. Stop clock pulses when a "compare" signal is generated by the analog comparator 19.
11. Load the count remaining in the up/down counter 22 into display system.

The clock and mode control logic 18, which controls the foregoing sequence of events, is illustrated in the logic diagram shown in FIG. 2. The clock 27 may include an oscillator and pulse forming circuits to provide clock pulses to the system. A measurement is initiated by a start pulse applied to one input of OR gate 28, the output of which sets flip-flop 29. Flip-flop 29 enables AND gate 30 which then passes the clock pulses from clock 27 to a decade counter 31. The parallel outputs of decade counter 31 are connected to a binary coded decimal (BC D)-to-decimal converter 32. The first decimal count output from BCD-to-decimal converter 32 is the sample $V_{in}$ control signal which is connected on the one hand to gates 13 and 14, and on the other hand to a one-shot multivibrator 33 through an OR gate 34. The output pulse from one-shot 33 is used to reset flip-flop 29 and thereby inhibit the clock pulses to decade counter 31. The first decimal count output of BCD-to-decimal converter 32 is also connected to enable AND gate 35, the output of which is connected to the "count up" input to the up/down counter 22.

The output of one-shot 33 is additionally connected to the input of one-shot 36, which is triggered by the trailing edge of the output pulse from one-shot 33. The output of one-shot 36 sets flip-flop 37 which enables AND gate 38. The output of clock 27 is connected through AND gate 38 to AND gate 35. Thus, the decimal one output from BCD-to-decimal converter 32 selects the "count up" mode for the up/down counter 22, and when one shot 36 is fired setting flip-flop 37 and enabling AND gate 38, clock pulses are applied to the count up input of up/down counter 22, as well as to DAC counter 20. The delay introduced by one-shot 33 is typically on the order of 20μsec. and is used to allow the output of high gain differential amplifier 15 to stabilize before searching for a "compare.".

When a "compare" signal is generated by the analog comparator, this signal is used to reset flip-flop 37 thereby disabling AND gate 38 and stopping all further clock pulses to the count up input of up/down counter 22. The compare signal is also applied through OR gate 28 to set flip-flop 29 thereby once again enabling AND gate 30. As a result, decade counter 31 begins to count again, and the second decimal count output from BCD-to-decimal converter 32 is a "reset A" which resets the DAC counter 20. The third decimal count output from the BCD-to-decimal converter is not used, but the fourth decimal count output is the sample $V_{REF}$ which controls gates 16 and 17 to apply ground reference potential to the input of differential amplifier 15. This fourth decimal count output is also applied to one-shot 33 through OR gate 34 and further enables AND gate 39. The output of AND gate 39 is connected to the count down input of up/down counter 22.

As before, the output pulse from one-shot 33 resets flip-flop 29 thereby blocking further clock pulses to decade counter 31. One-shot 36 triggers on the trailing edge of the output pulse of one-shot 33 and sets flip-flop 37 to enable AND gate 38 thereby applying clock pulses to the count down input of up/down counter 22 and the DAC counter 20.

When a second "compare" signal is generated by the analog comparator, 19, flip-flop 37 is reset, stopping the clock pulses to the count down input of up/down counter 22, and flip-flop 29 is set to once again apply clock pulses to decade counter 31. The fifth decimal count from BCD-to-decimal converter 32 is not used, but the sixth decimal count is the "load display latches" signal which enables the display latches 23 to assume the count remaining in the up/down counter 22. The seventh decimal count output of the BCD-to-decimal converter 32 is not used, but the eighth decimal count is a "reset B" signal which resets the DAC and up/down counters 20 and 22. The ninth and tenth decimal counts could be used to signal an end of the measurement and to reset the system.

The principles of the measurement thus far described are illustrated in FIGS. 3A, 3B and 3C. FIG. 3A represents the voltage input to differential amplifier 15 from gates 13 and 14. FIG. 3B represents the output of differential amplifier 15 and illustrates the offset plus drift voltage which is associated with that output. FIG. 3C illustrates the digital-to-analog converter output showing the timing for the measurement of the unknown input voltage $V_{in}$ during which the up/down counter 22 counts in the forward or up direction. After the first "compare" signal is generated by the analog comparator 19, the digital-to-analog converter again generates an outut voltage during which a measurement of ground reference potential is made and the up/down counter 22 counts in the backward or down direction. It will be appreciated by those skilled in the art that this add-substract feature which permits the nulling of any drift voltage following each measurement allows very inexpensive circuitry to be used for the very high gain differential amplifier 15.

To go along with the analog-to-digital converter which makes up the digital voltage meter, a self-referencing current source is used to provide a current into an unknown resistance for resistance measurements. FIG. 4 shows in schematic form the current source for resistance measurements which eliminates common mode voltage problems that might ordinarily be encountered using amplifiers with gains on the order of 1000. The current source comprises a bipolar transistor 40 having its emitter connected through resistor 41 to a source of negative potential and its base connected to circuit ground. The collector of transistor 40 is connected to the negative input of differential amplifier 42. A feedback resistor 43 is connected between the output of differential amplifier 42 and its negative input terminal. In addition, current feedback is provided by means of resistor 44 which is connected between the output of differential amplifier 42 and its positive input. Resistor 44 is also connected to test probe 45 and to one side of the unknown resistor $R_x$. The $+V_{in}$ input terminal 11 of gate 13 is connected to this same end of the unknown resistance $R_x$ through test probe 46.

The current source includes a virtual ground circuit which comprises a second differential amplifier 7. The differential amplifier 47 negative input is connected to the $-V_{in}$ terminal 12 of gate 14. The positive input of the differential amplifier 47 is connected to test probe 48 and to second end of unknown resistance $R_x$. $-V_{in}$ terminal 12 of gate 14 also goes to the lower end of $R_x$ through test probe 49. The virtual ground circuit is configured such that the voltage developed at test probe 47 will be the voltage that the virtual ground amplifier 46 output will go below circuit ground. This causes the negative $V_{in}$ terminal 12 to have no input bias voltage, thereby eliminating the common mode voltage problem previously encountered.

It will be apparent that the embodiment shown is only exemplary and that various modifications can be made in construction and arrangement within the scope of the invention as defined in the appended claims.

I claim:

1. An analog-to-digital converter comprising:
   high gain differential amplifier means for generating an output signal proportional to a voltage difference across its inputs, said output signal including a true and a drift voltage component, said high gain differential amplifier having offset adjustment means for adjusting the output voltage signal from said high gain differential amplifier so that said drift voltage component is always positive;
   clock and mode control logic means for generating clock pulses and control signals;
   a binary counter responsive to said clock pulses;
   a digital-to-analog converter connected to said binary counter for generating an analog voltage signal proportional to the binary count accumulated in said binary counter;
   comparator means responsive to said output and analog voltage signals for generating a compare signal when said voltage signals are equal, said binary counter being reset by said clock and mode control logic means each time a compare signal is generated by said comparator means;
   reversible counter means responsive to said clock pulses and operating synchronously with said binary counter for counting in a first direction, said clock and mode control logic means being responsive to said compare signal for stopping the counting operation of said reversible counter means whereby the accmulated count in said reversible counter means is a digital indication of the value of said true and drift voltage components;
   means responsive to said clock and mode control logic means for generating a null voltage across the inputs of said high gain amplifier means, said high gain amplifier means then generating an output voltage signal in response to null voltage which comprises only said drift voltage components; and said clock and mode control logic means again providing clock pulses to said binary counter and said reversible counter means, said reversible counter means counting in a second direction until said comparator means generates a compare signal when said drift voltage component and said analog voltage signal are equal, said reversible counter means thereby providing a digital output indication of the value of said true voltage component only.

2. An analog-to-digital converter as recited in claim 1, wherein said means for generating a null voltage comprises first switch pair means and second switch pair means, said first switch pair means being controlled by said clock and mode control logic means for connecting a voltage to be measured across the inputs of said high gain differential amplifier, and said second switch pair means being controlled by said clock and mode control logic means for connecting a ground reference potential across the inputs of said high gain differential amplifier.

3. An analog-to-digital converter as recited in claim 1 further comprising self biasing current source means for supplying current to a resistor of unknown resistance value, said resistor being connected across the input terminals of said high gain amplifier means.

4. An analog-to-digital converter as recited in claim 3 wherein said self biasing means comprises a current source adapted to be connected to one terminal of said resistor and a virtual ground circuit adapted to be connected to the other terminal of said resistor.

5. An analog-to-digital converter as recited in claim 4 wherein said virtual ground circuit comprises a second differential amplifier having positive and negative inputs, and positive input being connected to circuit ground and said negative input being connected to the output of said second differential amplifier, the output of said second differential amplifier adapted to be connected to said other terminal of said resistor.

6. A method of providing a digital indication of an analog input voltage comprising:
   connecting said analog input voltage across the input of a high gain differential amplifier to generate at the output of said high gain differential amplifier a voltage signal including true and drift voltage components;
   adjusting the output voltage signal from said high gain differential amplifier so that said drift voltage component is always positive;
   generating clock pulses;
   counting said clock pulses in a binary counter;
   generating an analog voltage signal proportional to the binary count accumulated in said binary counter;
   comparing the output of said high gain differential amplifier with said analog voltage signal and generating a first compare signal when said analog voltage signal is equal to the output voltage signal of said high gain differential amplifier;
   synchronously counting in an up/down counter in a first direction while generating said analog voltage signal until said first compare signal is generated, the count accumulated in said up/down counter at the time of generation of said first compare signal being a digital representation of the value of said true and drift voltage components;

connecting a null voltage across the inputs of said high gain differential amplifier so that its otuput signal comprises only said drift voltage component; and again counting clock pulses in said binary counter and generating an analog voltage signal and synchronously counting in said up/down counter in the opposite direction until a second compare signal is generated, the count accumulated in said up/down counter at the time of the generation of said second compare signal being the value of said true voltage component only.

* * * * *